(12) United States Patent
Feurle et al.

(10) Patent No.: US 6,528,392 B2
(45) Date of Patent: Mar. 4, 2003

(54) DICING CONFIGURATION FOR SEPARATING A SEMICONDUCTOR COMPONENT FROM A SEMICONDUCTOR WAFER

(75) Inventors: Robert Feurle, Neubiberg (DE); Dominique Savignac, Ismaning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/745,541

(22) Filed: Dec. 21, 2000

(65) Prior Publication Data

US 2001/0005617 A1 Jun. 28, 2001

(30) Foreign Application Priority Data

Dec. 21, 1999 (DE) .......................... 199 61 790

(51) Int. Cl.[7] .............................................. H01L 21/78
(52) U.S. Cl. ...................................... 438/460; 438/462
(58) Field of Search .................. 438/462, 460; 216/52; 257/620

(56) References Cited

U.S. PATENT DOCUMENTS

| 3,798,135 | A | | 3/1974 | Bracken |
| 5,136,354 | A | | 8/1992 | Morita et al. |
| 5,593,925 | A | | 1/1997 | Yamaha |
| 5,899,729 | A | * | 5/1999 | Lee ............................ 438/460 |
| 5,943,591 | A | | 8/1999 | Vokoun et al. |
| 5,998,282 | A | | 12/1999 | Likaszek |
| 6,022,792 | A | * | 2/2000 | Ishii ........................... 438/462 |

FOREIGN PATENT DOCUMENTS

EP  0 806 795 A2  11/1997

* cited by examiner

*Primary Examiner*—John F. Niebling
*Assistant Examiner*—André C Stevenson
(74) *Attorney, Agent, or Firm*—Laurence A. Greenberg; Werner H. Stemer; Gregory L. Mayback

(57) ABSTRACT

The dicing configuration for separating a semiconductor component from a semiconductor wafer is formed with a rupture joint which is created together with connecting holes that interconnect metallization planes, in a transition area between a scribe line and the semiconductor component. The rupture joint is an additional recess with which the insulating layer is made thinner.

5 Claims, 1 Drawing Sheet

DICING CONFIGURATION FOR SEPARATING A SEMICONDUCTOR COMPONENT FROM A SEMICONDUCTOR WAFER

BACKGROUND OF THE INVENTION

Field of the Invention

The invention lies in the semiconductor technology field and pertains, more specifically, to an apparatus for separating a semiconductor component, such as a semiconductor chip from a semiconductor wafer. The dicing separation is effected along a scribe line. An insulating layer is provided on the semiconductor wafer, in which a number of metallization planes are formed. A top metallization plane is electrically connected to an underlying metallization plane via a connecting hole.

Semiconductor components are usually separated from a wafer by sawing along a scribe line which establishes the boundaries between the individual semiconductor chips in the semiconductor wafer. The separation is referred to as "dicing." Sawing the semiconductor wafer apart must be done in such a manner that cracking in the individual semiconductor components is reliably prevented.

An apparatus is described in published European patent application EP 0 806 795 A2, in which, in order to prevent cracking in an insulating layer during the separation of a semiconductor component from a wafer along a scribe line in the insulating layer, a number of metallization planes is formed, a top metallization plane of which is electrically connected to an underlying metallization plane via a connecting layer in a connecting hole. The configuration described in the preceding introductory text is thus known from that publication.

Semiconductor components, such as, in particular, memory chips, often contain fuses which are situated in the transition area between the semiconductor chip and the scribe line and store information which is needed at wafer level but can be omitted after the semiconductor wafer has been sawn apart. For this reason, these fuses are preferably accommodated in the sawing edge or the kerf of the individual semiconductor chips on both sides of the scribe line. Such fuses often consist of polycrystalline silicon which is caused to melt by currents above a certain current intensity. These so-called "polyfuses" have previously been provided by etching fuse windows into the kerf of the semiconductor chips. As a result, the layer thickness of the insulating layer, i.e. especially of the silicon dioxide layer on the semiconductor wafer, is here reduced which considerably facilitates the sawing-apart of the semiconductor wafer.

For some time, however, polyfuses have been increasingly replaced by metal fuses which are formed, for example, by vapor deposition of thin metal films on an insulating base. These metal fuses are situated distinctly higher than the previous polyfuses and are arranged above the so-called "polylevel." Polycrystalline silicon filling structures are also frequently introduced in the transition area between semiconductor chip and scribe line in order to create surfaces here which are as level as possible.

Both measures, namely, on the one hand, the increasing use of metal fuses and, on the other hand, the use of polycrystalline silicon filling structures, lead to the insulating layer being made much thicker than previously in the transition area between the semiconductor chip and the scribe line, i.e. in the kerf, which makes separating the individual semiconductor chips, by sawing, from the semiconductor wafer along the scribe line much more difficult. In consequence, the yield of semiconductor components is reduced since numerous semiconductor components become useless due to cracking because the sawing has become much more difficult.

SUMMARY OF THE INVENTION

The object of the present invention is to provide a dicing configuration for separating a semiconductor component from a semiconductor wafer along a scribe line which overcomes the above-noted deficiencies and disadvantages of the prior art devices and methods of this general kind, and which reliably avoids cracking during the sawing-apart of the semiconductor wafer in a simple manner.

With the above and other objects in view there is provided, in accordance with the invention, a dicing configuration for separating a semiconductor component from a semiconductor wafer along a scribe line, wherein an insulating layer is formed on the semiconductor wafer, and a number of metallization planes are formed in the insulation layer, with a top metallization plane electrically connected to an underlying metallization plane via a connecting layer in a connecting hole formed in the insulation layer. The insulating layer is formed with an additional recess together with the connecting hole, for thinning the insulating layer in a transition area between the semiconductor component and the scribe line.

In other words, in the configuration of the type initially mentioned there is provided an additional recess, which is introduced together with the connecting hole, for thinning the insulating layer in the transition area between the semiconductor chip and the scribe line.

In the arrangement according to the invention, the step for forming a connection between the top metallization plane and the underlying metallization plane, which is necessary in any case, is used for making the insulating layer thinner in the transition area between the semiconductor chip and the scribe line which then considerably facilitates sawing the semiconductor wafer apart into the individual semiconductor chips.

In accordance with an added feature of the invention, only the insulating layer is provided on the semiconductor body in a region of the additional recess between the semiconductor body and the scribe line.

In accordance with an additional feature of the invention, the transition area is approximately 3 $\mu$m wide.

In accordance with a concomitant feature of the invention, there are formed a plurality of recesses in the insulating layer for thinning the insulation layer in the transition area.

There is also provided a dicing method for separating a semiconductor component from a semiconductor wafer along a scribe line, which comprises:

forming a first metallization plane on a semiconductor wafer;

depositing an insulating layer on the semiconductor wafer and on the first metallization plane;

forming a connecting hole in the insulating layer down to the first metallization plane and simultaneously forming an additional recess in the insulating layer for thinning the insulating layer in a transition area between the connecting hole and a scribe line;

depositing a plurality of metallization planes in the insulation layer, with a top metallization plane electrically connected to the first metallization plane via a connecting layer in the connecting hole; and separating the semiconductor component from the semiconductor wafer along the scribe line.

In addition, only the insulating layer is provided on the semiconductor body in the transition area between the semiconductor chip and the scribe line so that there is no polycrystalline silicon filling structures there. This measure, too, furthers simpler sawing-apart of the semiconductor wafer into the individual semiconductor chips.

Other features which are considered as characteristic for the invention are set forth in the appended claims.

Although the invention is illustrated and described herein as embodied in an dicing configuration for separating a semiconductor chip from a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
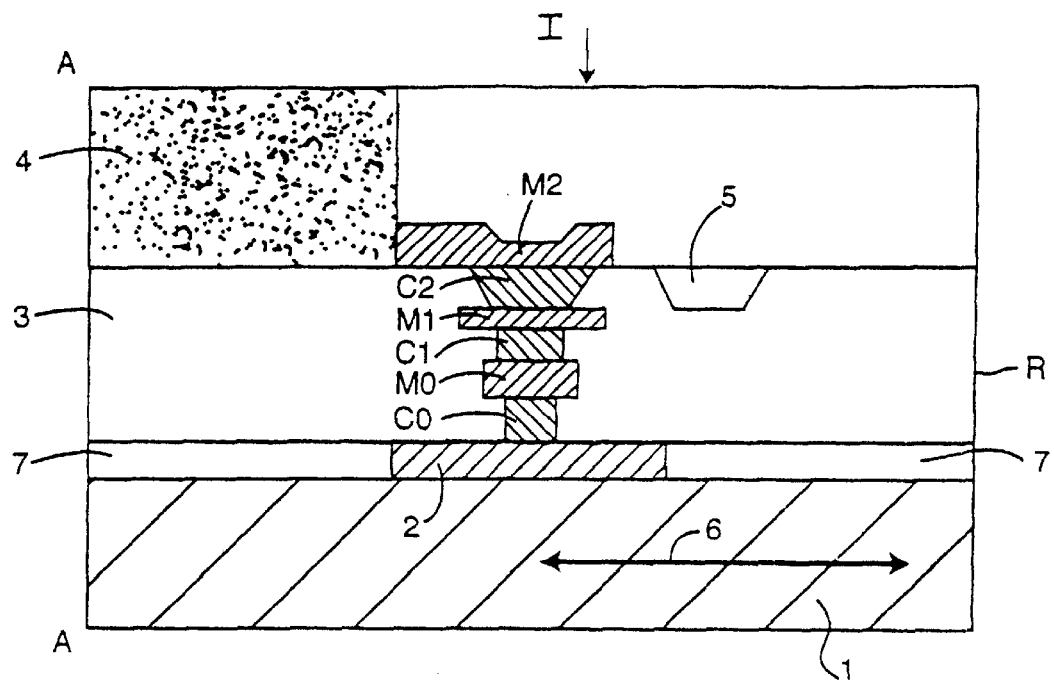
FIG. 1 is a partial sectional view of a semiconductor component in the vicinity of a scribe line R.
Figure 2:
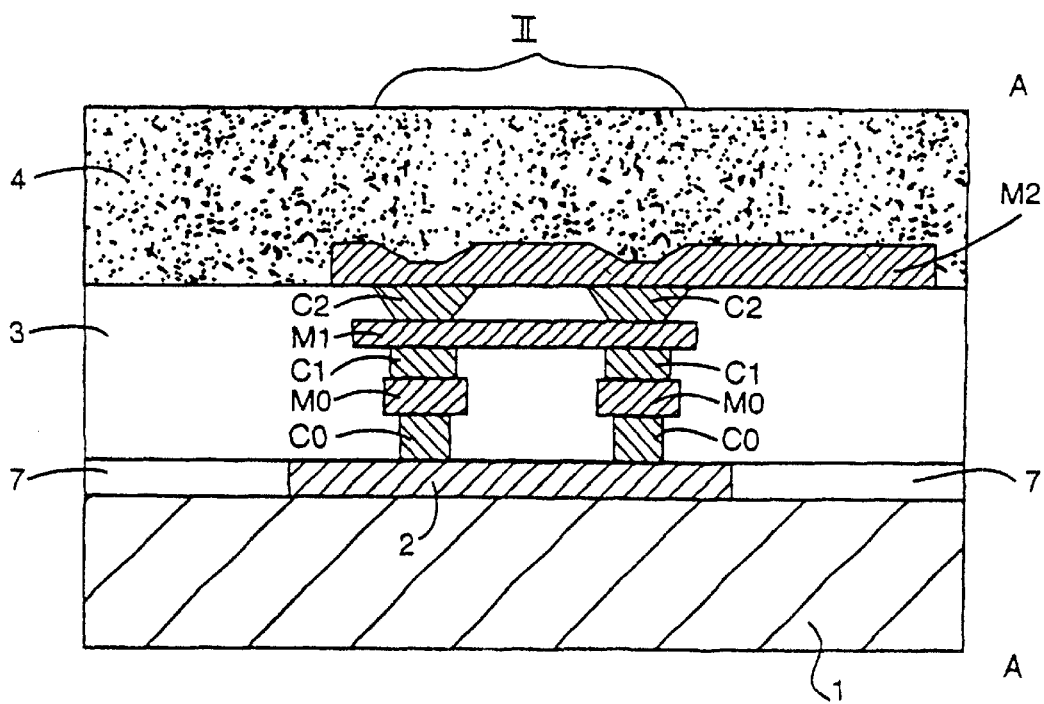
FIG. 2 is a sectional view of an area of the semiconductor component adjoining the area of FIG. 1 along an area AA.

Referring now to the figures of the drawing in detail there is illustrated an edge area of a semiconductor component, adjoining the scribe line R (the dicing channel R), with a crack stop structure I in FIG. 1 and an edge seal structure II in FIG. 2. The crack stop structure I prevents the propagation of thin cracks into the interior of the semiconductor component which may arise during the sawing along the scribe line R. The edge seal structure II is used for sealing against moisture, etc.

Both structures I and II are formed with a lower connecting layer C0 to a p-conducting diffusion region 2 on a p-conducting silicon semiconductor substrate 1, which may also contain a p-conducting well below the diffusion region 2, a lower metallization plane M0, a center connecting layer C1 between the lower metallization plane M0 and a center metallization plane M1, and a top connecting layer C2 between the center metallization plane M1 and a top metallization plane M2. In this configuration, the top metallization plane M2 forms a ground or GND bus in the area of the edge seal structure II.

Structures I and II are introduced into a silicon dioxide layer 3 which is also provided with a polyimide and passivation layer 4 within the structure I. The polyimide and passivation layer 4 covers the top metallization M2 of the structure II.

In FIG. 1, the area adjoining the scribe line R forms the kerf. The polyimide and passivation layer 4 has been omitted in this area and above the structure I.

Together with the opening for the connecting layer C2, a recess 5 is produced in the silicon dioxide layer 3 in the area of the kerf in the configuration according to the invention in order to reduce the oxide thickness here. The recess 5 can also be made wider, if necessary, or provided several times.

In addition, it is possible to make the silicon dioxide layer 3 thinner, if necessary, in the area of the kerf before the vapor deposition of the metal fuses and to provide a further recess, together with the opening for the connecting layer C2, below the thinned area.

In other words, in the configuration according to the invention, the silicon dioxide layer 3 is made thinner in the area of the kerf, i.e. on the right-hand side of the top metallization M2 in FIG. 1, for which purpose the process step for forming the opening for the connecting layer C2 is used.

This is because this process step creates recesses 5 in the area of the kerf so that the silicon dioxide layer 3 is considerably reduced in thickness here which considerably facilitates the subsequent sawing-apart of the semiconductor wafer along the scribe line R.

In addition, no filling with polycrystalline silicon, i.e. no "polyfill structure" is provided within the transition area between the semiconductor component and the scribe line. This is indicated by a double arrow 6 in FIG. 1. As a result, only the "thinned" silicon dioxide layer 3 exists here. This measure, too, furthers the sawing-apart of the semiconductor wafer into the individual semiconductor components.

In the exemplary embodiment shown, three metallization planes M0, M1 and M2 and three connecting layers C0, C1 and C2 are provided. Naturally, there may also be only two or more than three metallization planes with corresponding connecting layers.

For the metallization planes and connecting layers, aluminum can be used, for example. However, other metals may also be used.

Furthermore, the p-conducting silicon semiconductor substrate 1 is covered by a thin oxide layer 7. outside the p-conducting diffusion zone 2 in the exemplary embodiment shown. This oxide layer 7 may also be omitted.

It will be understood that, instead of the p-conducting silicon semiconductor substrate, an n-conducting semiconductor substrate of a semiconductor material other than silicon can also be used.

The important factor of the present invention is, however, that a "rupture joint" is created in the area of the kerf, i.e. on the right-hand side of the top metallization M2 in FIG. 1, in that the process for forming the connecting opening C2 is utilized for creating, at the same time as this connecting opening C2, at least one further recess 5 in the area of the kerf. This recess 5 makes the silicon dioxide layer 3 thinner so that it can be separated more easily by sawing in the scribe line and the risk of severe cracking is considerably reduced.

We claim:

1. In a dicing configuration for separating a semiconductor component from a semiconductor wafer along a scribe line, wherein an insulating layer is formed on the semiconductor wafer, and a number of metallization planes are formed in the insulation layer, with a top metallization plane electrically connected to an underlying metallization plane via a connecting layer in a connecting hole formed in said insulation layer, the improvement which comprises:

the insulating layer having an additional recess formed therein, together with the connecting hole, for thinning the insulating layer in a transition area between the semiconductor component and the scribe line.

2. The configuration according to claim 1, wherein only the insulating layer is provided on the semiconductor body in a region of said additional recess between the semiconductor body and the scribe line.

3. The configuration according to claim 1, wherein the transition area is approximately 3 µm wide.

4. The configuration according to claim 1, wherein said additional recess is one of a plurality of recesses formed in the insulating layer for thinning the insulation layer in the transition area.

5. In a dicing configuration for separating a semiconductor component from a semiconductor wafer along a scribe line, wherein an insulating layer is formed on the semiconductor wafer, and a number of metallization planes are formed in the insulation layer, with a top metallization plane electrically connected to an underlying metallization plane via a connecting layer in a connecting hole formed in said insulation layer, the improvement which comprises:

the insulating layer having an additional recess formed therein, together with the connecting hole, for thinning the insulating layer in a transition area between the semiconductor component and the scribe line, wherein the transition area is approximately 3 µm wide.

\* \* \* \* \*